(12) United States Patent
Motoyama et al.

(10) Patent No.: US 12,057,395 B2
(45) Date of Patent: Aug. 6, 2024

(54) TOP VIA INTERCONNECTS WITHOUT BARRIER METAL BETWEEN VIA AND ABOVE LINE

(71) Applicant: International Business Machines Corporation, Armonk, NY (US)

(72) Inventors: Koichi Motoyama, Clifton Park, NY (US); Kenneth Chun Kuen Cheng, Shatin (HK); Chanro Park, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 396 days.

(21) Appl. No.: 17/474,222

(22) Filed: Sep. 14, 2021

(65) Prior Publication Data
US 2023/0077760 A1   Mar. 16, 2023

(51) Int. Cl.
*H01L 23/528*   (2006.01)
*H01L 21/768*   (2006.01)
(Continued)

(52) U.S. Cl.
CPC .... *H01L 23/5283* (2013.01); *H01L 21/76816* (2013.01); *H01L 21/76846* (2013.01);
(Continued)

(58) Field of Classification Search
CPC .............. H01L 23/5226; H01L 23/481; H01L 23/53238; H01L 21/76898; H01L 21/76816; H01L 21/76846; H01L 21/76852; H01L 21/76877; H01L 21/76831
See application file for complete search history.

(56) References Cited

U.S. PATENT DOCUMENTS 6,486,557 B1    11/2002  Davis
6,566,757 B1 *  5/2003   Banerjee ........... H01L 21/76829
                                          257/758
(Continued)

OTHER PUBLICATIONS

Motoyama et al., "Discrete Study of ALD TaN on Via and Line for Low Resistive and High Reliable Cu/Low-k Interconnects and Other Applications", ECS Journal of Solid State Science and Technology, vol. 1, No. 6, Oct. 10, 2012, 7 pages.

*Primary Examiner* — Jaehwan Oh
*Assistant Examiner* — John M Parker
(74) *Attorney, Agent, or Firm* — Edward J. Wixted, III

(57) ABSTRACT

Embodiments of the invention include a method for fabricating a semiconductor device and the resulting structure. A high modulus material layer is formed on a conductive stack. A trench is formed that exposes a surface of the liner and filled with metal. The metal is patterned to form interconnect lines and vias. The high modulus material is removed. A conformal layer is formed on exposed surfaces of the stack and the interconnect lines and vias. A low-κ dielectric is formed on the conformal layer such that the low-κ dielectric is of a height coplanar with the top surface of the vias. The conformal layer is removed from a top surface of the vias. A next level metal layer is formed on the top surface of the vias and low-κ dielectric layer such that added vias of the next level metal layer are directly on the top surface of the vias.

11 Claims, 10 Drawing Sheets

(51) Int. Cl.
  *H01L 23/522* (2006.01)
  *H01L 23/532* (2006.01)
(52) U.S. Cl.
  CPC .... *H01L 21/76852* (2013.01); *H01L 23/5226* (2013.01); *H01L 23/53238* (2013.01); *H01L 23/53252* (2013.01); *H01L 23/53295* (2013.01)

(56) References Cited

U.S. PATENT DOCUMENTS

| | | | | |
|---|---|---|---|---|
| 7,335,590 | B2* | 2/2008 | Suh | H01L 21/2855 438/712 |
| 8,461,041 | B2 | 6/2013 | Ozaki | |
| 9,391,019 | B2 | 7/2016 | Kobrinsky | |
| 9,613,861 | B2 | 4/2017 | Anderson | |
| 9,984,919 | B1 | 5/2018 | Zhang | |
| 10,468,298 | B2 | 11/2019 | Shusterman | |
| 2001/0055840 | A1* | 12/2001 | Verret | H01L 21/76882 438/142 |
| 2002/0182855 | A1* | 12/2002 | Agarwala | H01L 23/5283 257/E23.152 |
| 2003/0207561 | A1* | 11/2003 | Dubin | H01L 21/76843 257/E21.174 |
| 2004/0132282 | A1* | 7/2004 | Jiang | H01L 21/76846 438/626 |
| 2005/0001325 | A1* | 1/2005 | Andricacos | H01L 21/76849 257/E21.585 |
| 2005/0048765 | A1* | 3/2005 | Kim | H01L 21/76831 438/623 |
| 2005/0118796 | A1* | 6/2005 | Chiras | H01L 21/76805 438/618 |
| 2005/0136650 | A1 | 6/2005 | Tsuchida | |
| 2006/0234497 | A1* | 10/2006 | Yang | H01L 21/76814 438/638 |
| 2009/0273085 | A1* | 11/2009 | Jourdan | H01L 23/53295 257/E21.584 |
| 2010/0078815 | A1* | 4/2010 | Wang | H01L 23/53252 257/E23.141 |
| 2011/0068471 | A1* | 3/2011 | Ozaki | H01L 21/76826 257/E23.161 |
| 2015/0056800 | A1 | 2/2015 | Mebarki | |
| 2016/0111329 | A1 | 4/2016 | Zhang | |
| 2019/0181033 | A1* | 6/2019 | Penny | H01L 21/76831 |
| 2021/0335663 | A1* | 10/2021 | Hsueh | H01L 21/7684 |

* cited by examiner

TOP VIA INTERCONNECTS WITHOUT BARRIER METAL BETWEEN VIA AND ABOVE LINE

BACKGROUND

The present invention relates generally to the field of semiconductor structures and fabrication, and more particularly to the fabrication of a top via and interconnect line structure that has no barrier between the via and line above the via by utilizing a high modulus template.

Back end of line (BEOL) is the portion of integrated circuit fabrication where the individual devices (transistors, capacitors, resisters, etc.) get interconnected with wiring on the wafer, the metallization layer. BEOL generally begins when the first layer of metal is deposited on the wafer. BEOL includes contacts, insulating layers (dielectrics), metal levels, and bonding sites for chip-to-package connections.

A via is an electrical connection between layers in a physical electronic circuit that goes through the plane of one or more adjacent layers. In integrated circuit design, a via is a small opening in an insulating oxide layer that allows a conductive connection between different layers.

SUMMARY

Embodiments of the invention include a method for fabricating a semiconductor device and the resulting structure. The method can include providing a conductive stack comprising a barrier liner, a liner, and a conductive line, where: the liner is positioned between the barrier liner and the conductive line; and a top surface of the conductive line is below a topmost surface of the liner. The method can also include forming a high modulus material layer on the conductive stack. The method can also include forming a trench of a depth that exposes a topmost surface of the liner. The method can also include filling the trench with metal. The method can also include patterning the metal to form metal interconnect lines and vias. The method can also include removing the high modulus material layer. The method can also include forming a conformal dielectric layer on exposed surfaces of the conductive stack and the metal interconnect lines and vias. The method can also include forming a low-κ dielectric layer on the conformal dielectric layer such that the low-κ dielectric layer is of a height coplanar with the top surface of the vias. The method can also include removing the conformal dielectric layer from a top surface of the vias. The method can also include
   forming a next level metal layer on the top surface of the vias and low-κ dielectric layer such that added vias of the next level metal layer are directly on the top surface of the vias.

DETAILED DESCRIPTION

Figure 1:
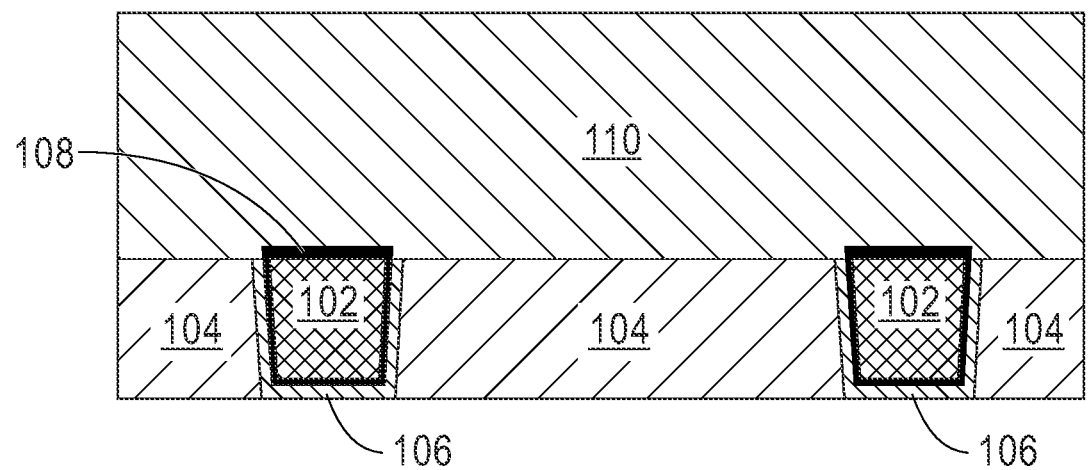
FIG. 1 depicts a semiconductor structure after an initial set of processing operations, in accordance with an embodiment of the invention.

Embodiments of the present invention recognize that, for back end of line (BEOL) pitch scales below 30 nanometers (nm), resistance-capacitance product (RC) is high, resulting in RC delay being unsustainably large. Embodiments of the present invention recognize that top via integration schemes may reduce RC relative to International Technology Roadmap for Semiconductors (ITRS) projections. Embodiments of the present invention recognize challenges associated with line wiggling (i.e., trench critical dimension (CD) variability issues) caused by using metals other than copper (Cu), such as ruthenium (Ru) and cobalt (Co), as interconnect material for pitch below 30 nm. Embodiments of the present invention further recognize that using high modulus template material can be effective to address such challenges, but that capacitance increase should also be addressed. Embodiments of the present invention disclose a fabrication method and structure to reduce line wiggling using top via interconnects without barrier metal between the via and upper metal line above by using a high modulus template (e.g., titanium nitride (TiN)). Embodiments recognize that using such an approach (i) reduces or eliminates line wiggling, even at small pitch (i.e., below 30 nm pitch), (ii) creates low via resistance (R), due to not having barrier metal between the via and above line, (iii) creates low line R by maximizing metal (e.g., Ru) volume without having a barrier metal at the sidewall, and (iv) creates low overall capacitance (C) by replacing a high modulus template with a low-κ dielectric that does not have reactive-ion etching (RIE) damage.

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Turning now to an overview of technologies that are more specifically relevant to aspects of the present invention, ICs are fabricated in a series of stages, including a front-end-of-line (FEOL) stage, a middle-of-line (MOL) stage, and a BEOL stage. The process flows for fabricating modern ICs are often identified based on whether the process flows fall in the FEOL stage, the MOL stage, or the BEOL stage. Generally, the FEOL stage is where device elements (e.g., transistors, capacitors, resistors) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another.

Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

As used herein, a "top via" refers to the "V," layer via which electrically couples a line below (an "$M_x$" layer) to a line above (an "$M_{x+1}$" layer). Embodiments of the present invention form an alternate metal top via (e.g., Co, Ru) on the line below. The line above has no barrier metal between the via and the line above.

The present invention will now be described in detail with reference to the Figures.

FIG. 1 depicts a cross-sectional view of a device at an early stage in the method of forming the device and after an initial set of fabrication operations according to one embodiment of the invention. FIG. 1 shows the formation of high modulus template 110 on an interconnect structure. The semiconductor structure of FIG. 1 includes high modulus template 110 deposited on the interconnect structure comprising conductive lines 102, dielectric layer 104, barrier liner 106, and liner 108. The interconnect structure (an "$M_x$" layer) in accordance with aspects of the invention can be fabricated by patterning conductive lines (e.g., Cu line) in a trench using lithography and an etch. In some embodiments of the invention, liner 108 made of an alternate metal (e.g., Ru) is formed in the trench prior to depositing the conductive line. In some embodiments of the invention, barrier liner 106 is formed in the trench prior to depositing liner 108. While not shown for ease of discussion, conductive lines 102 can be of many lines in a metallization layer of the interconnect structure. Moreover, it is understood that the processes described herein with respect to conductive lines 102 can be used to create hybrid metal interconnects in any of these metallization layers.

In some embodiments of the invention, conductive lines 102 include a conductive material formed or deposited in a trench of a metallization layer using known BEOL processes. In some embodiments of the invention, conductive lines 102 are overfilled above a surface of the trench (not shown), forming overburdens that can be removed using, for example, a chemical-mechanical planarization (CMP) process. Conductive lines 102 can be made of any suitable conducting material, such as, for example, metal (e.g., tungsten (W), titanium (Ti), tantalum (Ta), Ru, zirconium (Zr), Co, Cu, aluminum (Al), platinum (Pt)), alloys thereof (e.g., AlCu, CuMn, CuTi), conducting metallic compound material (e.g., tantalum nitride, TiN, tantalum carbide, titanium carbide, titanium aluminum carbide, tungsten silicide, tungsten nitride, cobalt silicide, nickel silicide), conductive carbon, or any suitable combination of such materials. In some embodiments of the invention, conductive lines 102 are copper lines (copper interconnect). Conductive lines 102 can be formed or deposited using, for example, chemical vapor deposition (CVD), plasma enhanced chemical vapor deposition (PECVD), physical vapor deposition (PVD), sputtering, plating, chemical solution deposition, and electroless plating.

In some embodiments of the invention, dielectric layer 104 is an interlayer dielectric. Dielectric layer 104 serves as an isolation structure for the lines and vias of the interconnect structure. Dielectric layer 104 can be made of any suitable dielectric material, such as, for example, low-κ dielectrics (i.e., materials having a small dielectric constant relative to silicon dioxide, i.e., less than about 3.9), ultra-low-κ dielectrics (i.e., materials having a dielectric constant less than 3), porous silicates, carbon doped oxides, silicon dioxides, silicon nitrides, silicon oxynitrides, silicon carbide (SiC), or other dielectric materials. Any known manner of forming the dielectric layer 104 can be utilized, such as, for example, CVD, PECVD, atomic layer deposition (ALD), flowable CVD, spin-on dielectrics, or PVD.

In some embodiments of the invention, barrier liner 106 can be formed between conductive lines 102 and dielectric layer 104. Barrier liner 106 can serve as a diffusion barrier, preventing the copper (or other metal) from diffusing into, or doping, the surrounding dielectric materials, which can degrade the surrounding dielectric material properties. Silicon, for example, forms deep-level traps when doped with copper. An ideal barrier metal liner limits copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

In some embodiments of the invention, liner 108 is formed between conductive lines 102 and barrier liner 106. In some embodiments of the invention, liner 108 is formed from a different material (e.g., metal) than conductive lines 102. For example, conductive lines 102 can be copper lines and liner 108 can be formed from an alternate metal. In some embodiments of the invention, liner 108 can be formed from materials that include a non-copper metal (e.g., tungsten, titanium, tantalum, ruthenium, zirconium, cobalt, aluminum, and platinum), alloys thereof, conducting metallic compound material (e.g., tantalum nitride, titanium nitride, tantalum carbide, titanium carbide, titanium aluminum carbide, tungsten silicide, tungsten nitride, cobalt silicide, and nickel silicide), conductive carbon, or any suitable combination of these materials. In some embodiments of the invention, liner 108 is made of Co or Ru. These alternate metals do not require a metal barrier liner. Liner 108 can be deposited prior to conductive lines 102 (and after forming barrier liner 106, if present). In some embodiments of the invention, the interconnect structure is planarized to a surface of barrier liner 106 and/or liner 108, exposing a surface of the dielectric layer 104. In some embodiments, such as the embodiment depicted in FIG. 1, liner 108 is also present on a top surface of conductive lines 102 and such a top surface of liner 108 may be deposited according to the techniques previously described after conductive lines 102 have been formed.

In some embodiments of the present invention, high modulus template 110 is formed by sputter, CVS, ALD, or another deposition process. High modulus template 110 is a high modulus material that can be patterned and selectively removed and may comprise, for example, TiN, $TiO_x$, TaN, or SiN. Embodiments of the present invention recognize that templates with higher modulus can mitigate post metal fill line wiggling. A TiN template, where high modulus template 110 is composed of TiN has a modulus of about 500 gigapascals (GPa), which is higher than many other materials.

Figure 2:
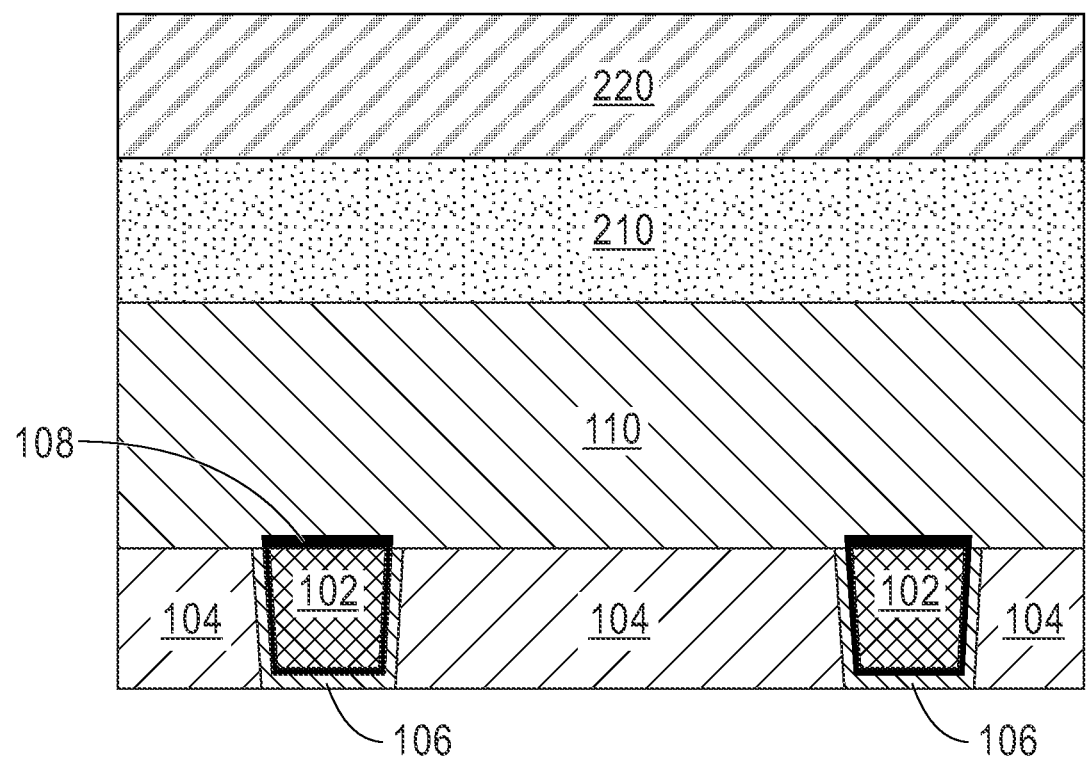
FIG. 2 depicts a process of forming a hardmask and photoresist, in accordance with an embodiment of the invention.

FIG. 2 depicts a cross-sectional view of fabrication steps, in accordance with an embodiment of the present invention. FIG. 2 shows the formation of hardmask 210 and photoresist 220.

Hardmask 210 is deposited on top of high modulus template 110. A hardmask is a material used in semiconductor processing as an etch mask. Hardmask 210 is composed of metal or a dielectric material such as, for example, such as, for example, a low-κ dielectric, a nitride, silicon nitride, silicon oxide, SiON, SiC, SiOCN, or SiBCN. In some embodiments of the invention, hardmask 210 is a silicon nitride or silicon oxide hard mask. In some embodiments of the invention, hardmask 210 is formed to a thickness of about 10 nm to about 60 nm, for example 30 nm, although other thicknesses are within the contemplated scope of the invention. Hardmask 210 may be deposited using, for example, any suitable process, such as CVD, plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), flowable CVD, spin-on dielectrics, physical vapor deposition (PVD), molecular beam epitaxy (MBE), chemical solution deposition, spin-on dielectrics, or other like process.

Photoresist 220 is deposited on top of hardmask 210. A photoresist is a light-sensitive material used in processes, such as photolithography, to form a patterned coating on a surface. Photoresist 220 may be a light-sensitive polymer. In various embodiments, standard photolithographic processes are used to define a pattern of hardmask 210 in a layer of photoresist 220 deposited on hardmask 210. The desired hardmask pattern may then be formed in hardmask 210 by removing hardmask 210 from the areas not protected by the pattern in the photoresist 220 layer. Hardmask 210 is removed using, for example, reactive ion etching (RIE). RIE uses chemically reactive plasma, generated by an electromagnetic field, to remove various materials. A person of ordinary skill in the art will recognize that the type of plasma used will depend on the material of which hardmask 210 is composed, or that other etch processes such as wet chemical etching or laser ablation may be used.

Figure 3:
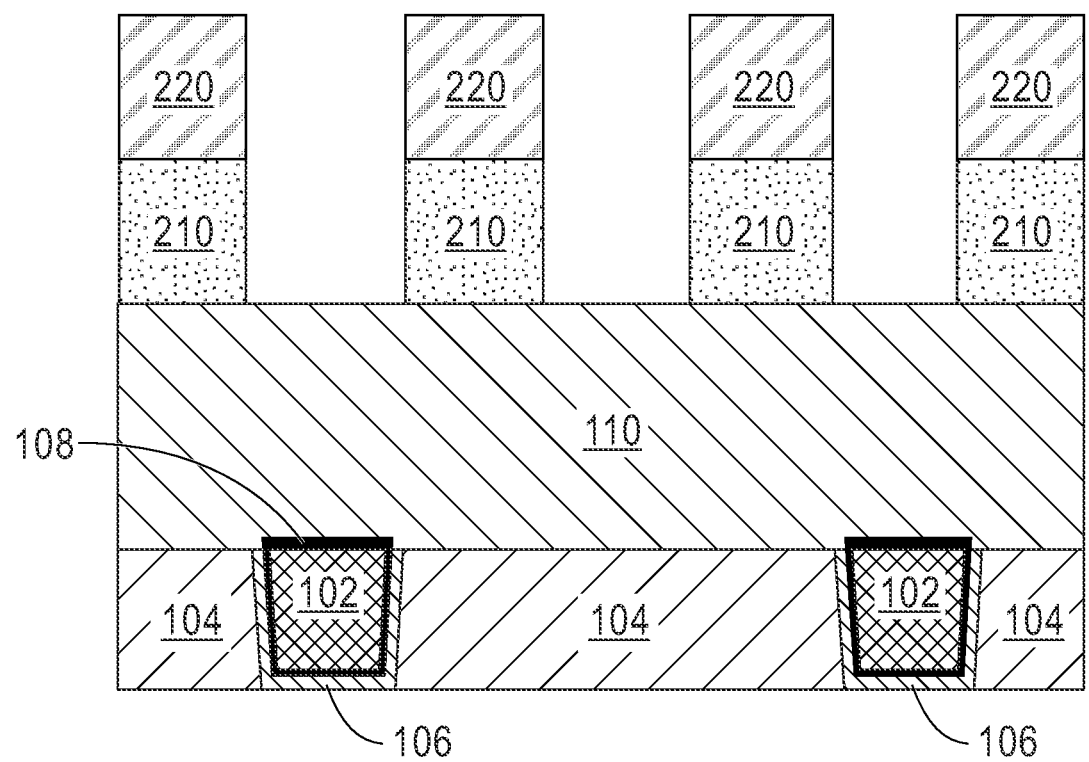
FIG. 3 depicts a process of patterning the hardmask and photoresist, in accordance with an embodiment of the invention.

FIG. 3 depicts a cross-sectional view of fabrication steps, in accordance with an embodiment of the present invention. FIG. 3 shows the patterning of hardmask 210 and photoresist 220 for subsequent trench formation within high modulus template 110.

As described above with reference to FIG. 2, hardmask 210 and photoresist 220 may be patterned utilizing photolithographic processes and the hardmask pattern shown in FIG. 3 may be formed by removing hardmask 210 from the areas not protected by the pattern in photoresist 220 using, for example, RIE.

Hardmask 210 may be patterned such that hardmask 210 exposes the areas of high modulus template 110 that are to become trenches for subsequent formation of vias.

Figure 4A:
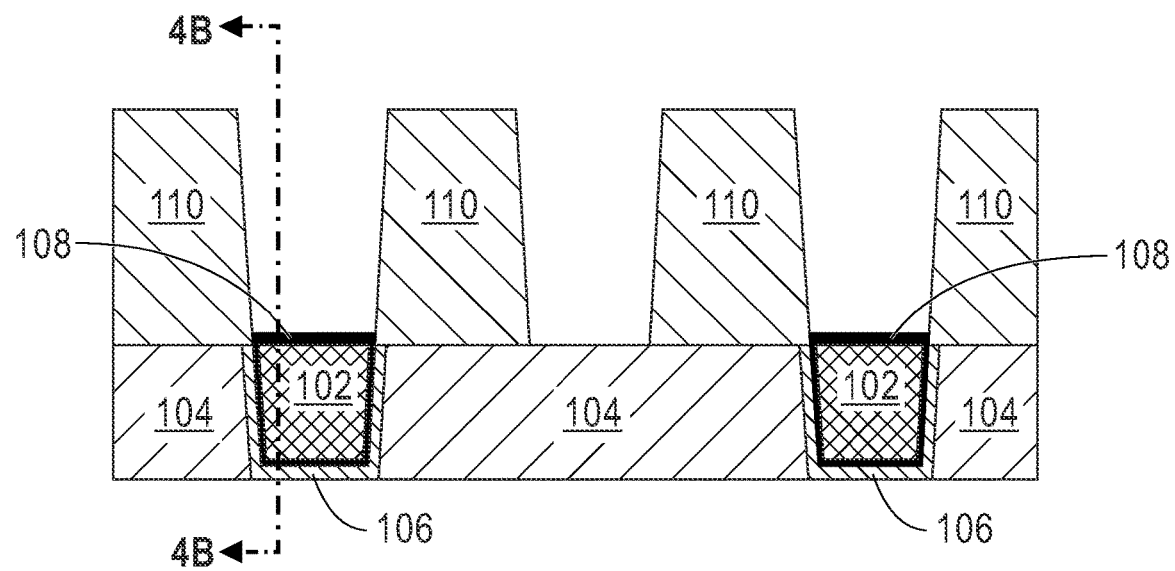
FIG. 4A depicts a process of forming trenches within a high modulus template and the removal of the hardmask and photoresist, in accordance with an embodiment of the invention.
Figure 4B:
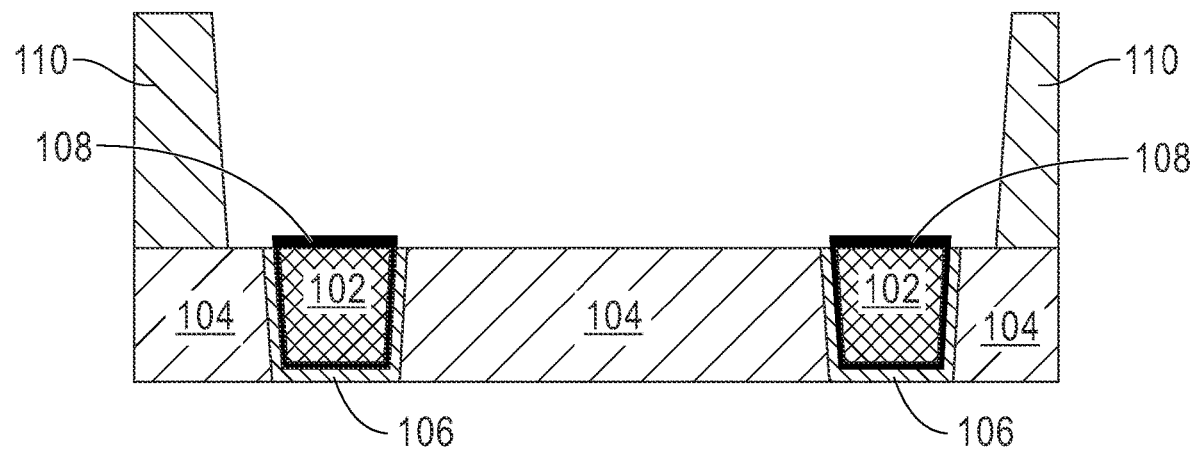
FIG. 4B depicts a cross-sectional view, along section line 4B of FIG. 4A, in accordance with an embodiment of the invention.

FIG. 4A depicts a cross-sectional view and FIG. 4B depicts a cross-sectional view, along section line 4B of FIG. 4A, of fabrication steps, in accordance with an embodiment of the present invention. FIGS. 4A and 4B show the formation of trenches within high modulus template 110 and the removal of hardmask 210 and photoresist 220.

Trenches may be formed by an etching process, such as RIE, laser ablation, or any etch process which can be used to selectively remove a portion of material such as high modulus template 110. As described above, with reference to FIG. 3, hardmask 210 may be patterned using photoresist 220 to expose areas of high modulus template 110 where trenches are desired and hardmask 210 may be utilized during the etching process in the creation of the trenches. The etching process only removes the portions of high modulus template 110 not protected by hardmask 210 and the etching process stops at dielectric layer 104 and liner 108.

In some embodiments, subsequent to the formation of the trenches, hardmask 210 is removed. In general, the process of removing hardmask 210 involves the use of an etching process such as RIE, laser ablation, or any etch process which can be used to selectively remove a portion of material, such as hardmask 210. In some embodiments, prior to the removal of hardmask 210, photoresist 220 is removed. The process of removing photoresist 220 is similar to that of the process of removing hardmask 210.

Figure 5A:
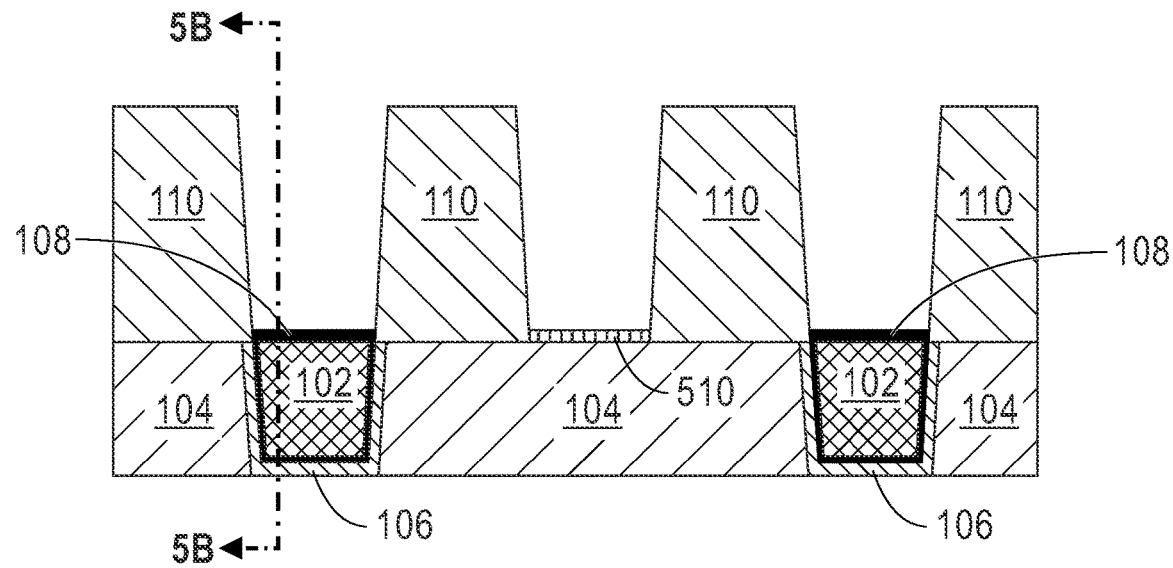
FIG. 5A depicts a process of forming a tantalum nitride (TaN) layer on exposed surfaces of a dielectric layer, in accordance with an embodiment of the invention.
Figure 5B:
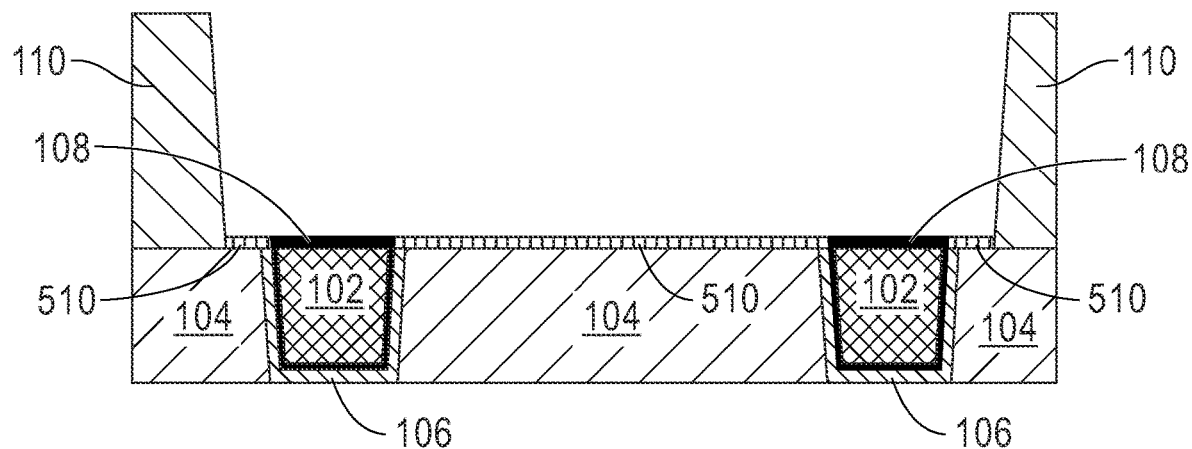
FIG. 5B depicts a cross-sectional view, along section line 5B of FIG. 5A, in accordance with an embodiment of the invention.

FIG. 5A depicts a cross-sectional view and FIG. 5B depicts a cross-sectional view, along section line 5B of FIG. 5A, of fabrication steps, in accordance with an embodiment of the present invention. FIGS. 5A and 5B show the formation of tantalum nitride (TaN) layer 510 on exposed surfaces of dielectric layer 104. In some embodiments, rather than TaN, TaN layer 510 may comprise tungsten nitride (WN) TaN acts as a diffusion barrier and insulating layer between copper interconnects in BEOL. TaN layer 510 may be deposited such that TaN layer 510 has a thickness from 0.5 nm to 1 nm.

TaN layer 510 may be deposited by, for example, CVD, PECVD, RF-magnetron-reactive sputtering, direct current (DC) sputtering, self-propagating high-temperature synthesis (SHS), low-pressure metalorganic chemical vapor deposition (LP-MOCVD), atomic layer deposition (ALD), ion beam assisted deposition (IBAD), electron beam evaporation of tantalum in concert with high energy nitrogen ions, or other deposition processes. In some embodiments, TaN layer 510 may be deposited using PVD and TaN layer 510 is subsequently mechanically processed (gridding/polishing) to achieve the desired thickness and expose liner 108. In other embodiments, TaN layer 510 is selectively deposited on dielectric layer 104 utilizing ALD. There is an incubation time period for ALD TaN growth on metal, such as liner 108 and high modulus template 110. Accordingly, for thin ALD deposition of TaN layer 510 (e.g., 1 nm or less), TaN will only grow on top of a dielectric surface such as dielectric layer 104.

Figure 6:
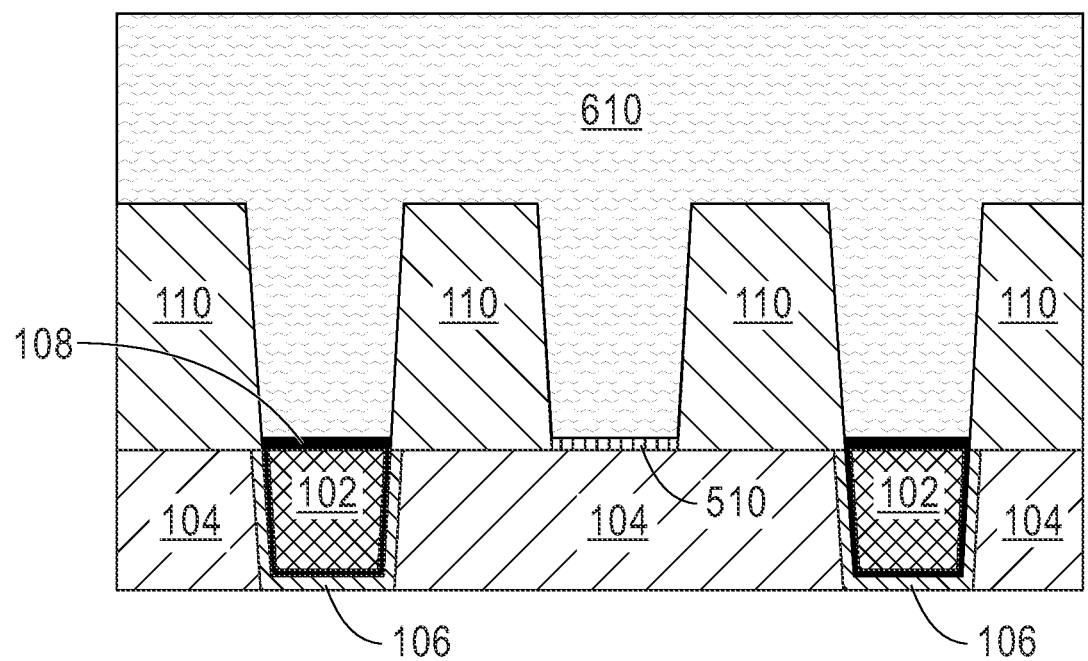
FIG. 6 depicts a process of forming a metal layer within and above trenches of the structure, in accordance with an embodiment of the invention.

FIG. 6 depicts a cross-sectional view of fabrication steps, in accordance with an embodiment of the present invention. FIG. 6 shows the formation of metal layer 610 within and above the trenches.

Metal layer 610 may be any type of conductive metal. For example, metal layer 610 may be composed of Ru, Co, Mo, W, Al, or Rh. Metal layer 610 may be deposited using, for example, CVD, PECVD, PVD, or other deposition processes. As depicted in FIG. 6, metal layer 610 is deposited above the desired height.

In some embodiments, line wiggles may be reduced because of the presence of high modulus template 110 compared to other types of templates that might be used. Embodiments of the present invention recognize that templates with higher modulus can mitigate post metal fill line wiggling. A TiN template, where high modulus template 110 is composed of TiN has a modulus of about 500 gigapascals (GPa), which is higher than many other materials.

Figure 7:
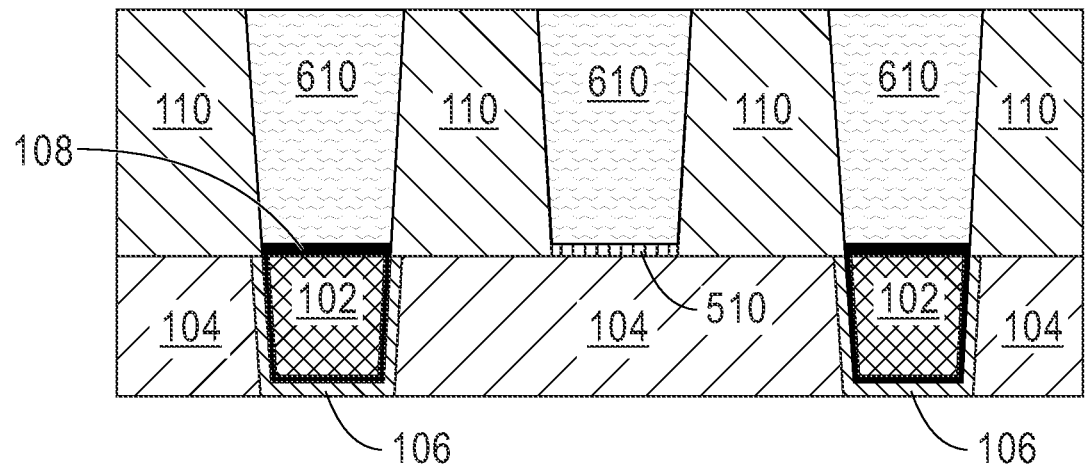
FIG. 7 depicts a process of removing portions of the metal layer to expose the top surfaces of the high modulus template, in accordance with an embodiment of the invention.

FIG. 7 depicts a cross-sectional view of fabrication steps, in accordance with an embodiment of the present invention. FIG. 7 shows the removal of upper portions of metal layer 610 to expose the top surfaces of high modulus template 110.

As described above with reference to FIG. 6, metal layer 610 may be deposited above the desired height. Subsequently, utilizing a planarization process, such as CMP, the height of metal layer 610 may be reduced such that the top surfaces of high modulus template 110 are exposed.

In some embodiments, where high modulus template 110 is comprised of TiN, line wiggle may be reduced compared to other material usage. Embodiments of the present invention recognize that templates with higher modulus can mitigate post metal fill line wiggling. A TiN template, where spacers 310 are composed of TiN has a modulus of about 500 GPa, which is higher than many other materials.

Figure 8:
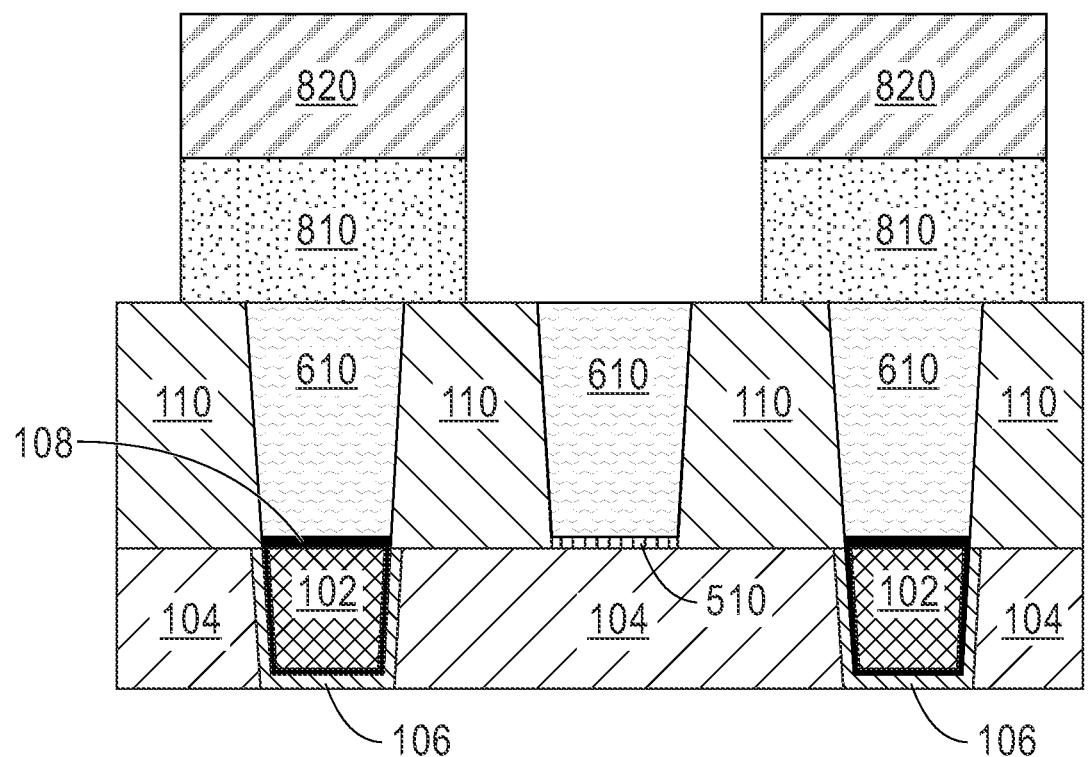
FIG. 8 depicts a process of forming and patterning a hardmask and photoresist, in accordance with an embodiment of the invention.

FIG. 8 depicts a cross-sectional view of fabrication steps, in accordance with an embodiment of the present invention. FIG. 8 shows the formation and patterning of hardmask 810 and photoresist 820 for via formation.

Hardmask 810 is deposited on top of the exposed to surfaces of high modulus template 110 and metal layer 610. Hardmask 810 is composed of metal or a dielectric material such as, for example, such as, for example, a low-κ dielectric, a nitride, silicon nitride, silicon oxide, SiON, SiC, SiOCN, or SiBCN. In some embodiments of the invention, hardmask 810 is a silicon nitride or silicon oxide hard mask. In some embodiments of the invention, hardmask 810 is formed to a thickness of about 10 nm to about 60 nm, for example 30 nm, although other thicknesses are within the contemplated scope of the invention. Hardmask 810 may be deposited using, for example, any suitable process, such as CVD, PECVD, UHVCVD, RTCVD, MOCVD, LPCVD, LRPCVD, ALD, flowable CVD, spin-on dielectrics, PVD, MBE, chemical solution deposition, spin-on dielectrics, or other like process.

Photoresist 820 is deposited on top of hardmask 810. Photoresist 820 may be a light-sensitive polymer. In various embodiments, standard photolithographic processes are used to define a pattern of hardmask 810 in a layer of photoresist 820 deposited on hardmask 810. The desired hardmask pattern may then be formed in hardmask 810 by removing hardmask 810 from the areas not protected by the pattern in the photoresist 820 layer. Hardmask 810 is removed using, for example, reactive ion etching (RIE). RIE uses chemically reactive plasma, generated by an electromagnetic field, to remove various materials. A person of ordinary skill in the art will recognize that the type of plasma used will depend on the material of which hardmask 810 is composed, or that other etch processes such as wet chemical etching or laser ablation may be used.

Figure 9A:
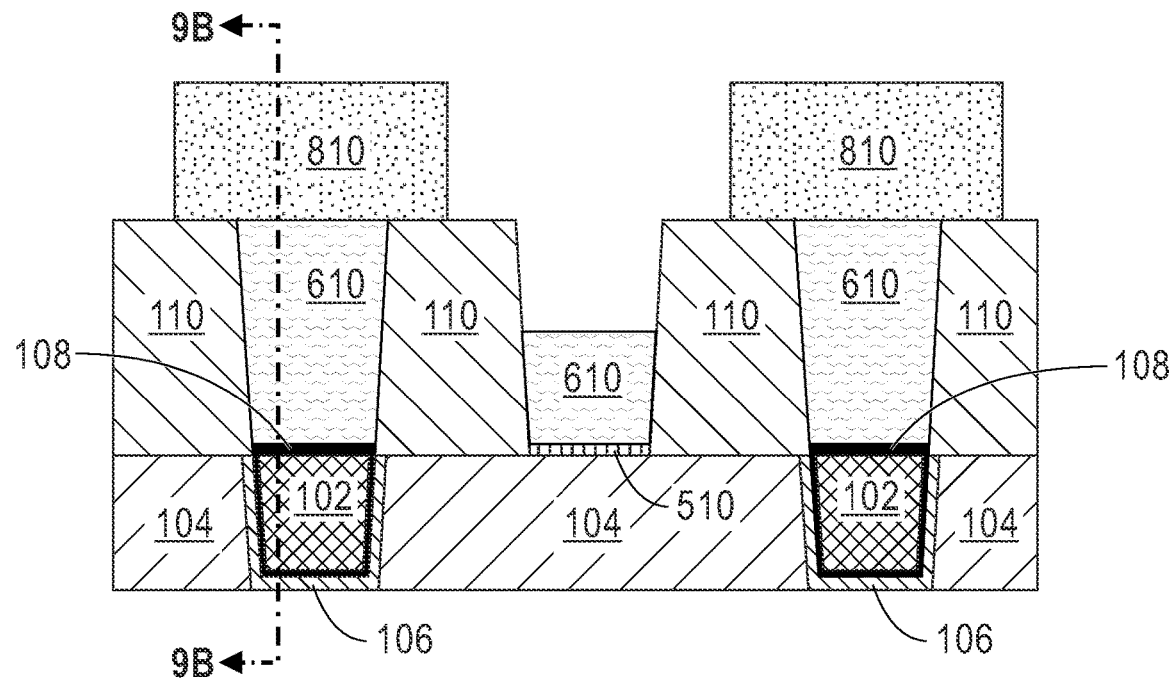
FIG. 9A depicts a process of forming metal vias in the metal utilizing an etching process and removing the photoresist, in accordance with an embodiment of the invention.
Figure 9B:
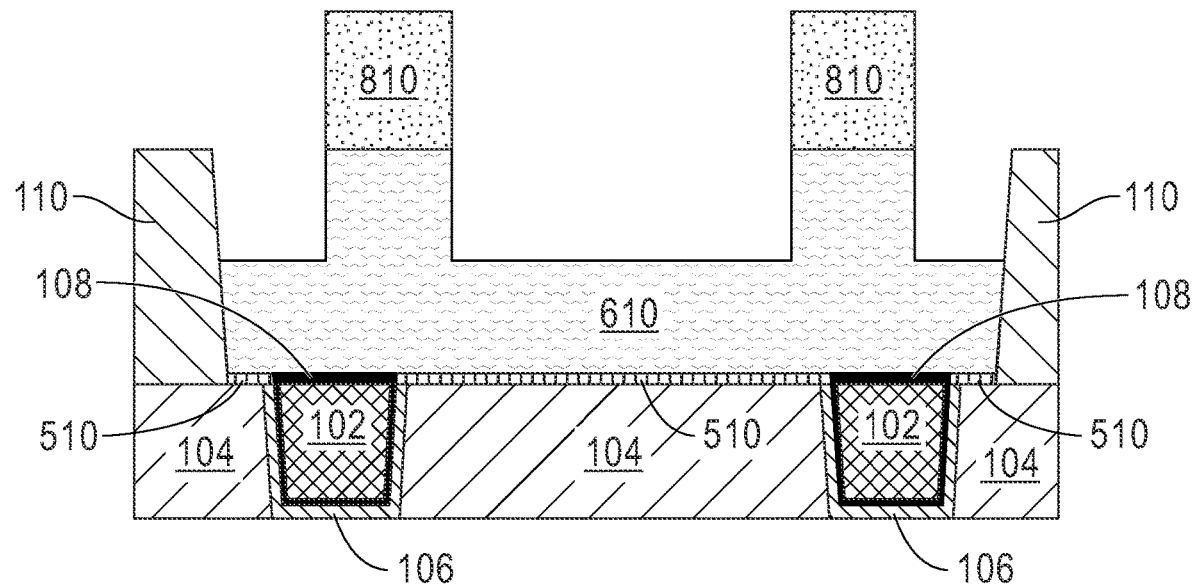
FIG. 9B depicts a cross-sectional view, along section line 9B of FIG. 9A, in accordance with an embodiment of the invention.

FIG. 9A depicts a cross-sectional view and FIG. 9B depicts a cross-sectional via, along section line 9B of FIG. 9A, of fabrication steps, in accordance with an embodiment of the present invention. FIGS. 9A and 9B show the formation of metal vias in metal layer 610 and the removal of photoresist 820.

Vias may be formed by an etching process on exposed portions of metal layer 610 (i.e., portions of metal layer 610 not protected by hardmask 810, such as RIE, laser ablation, or any etch process which can be used to selectively remove a portion of material such as metal layer 610. As described above, with reference to FIG. 8, hardmask 810 may be patterned using photoresist 820 to expose areas of metal layer 610 to facilitate the creation of desired vias and hardmask 810 may be utilized during the etching process in the creation of the vias. The etching process only removes the portions of metal layer 610 not protected by hardmask 810 and the etching process is stopped upon the exposed portions of metal layer 610 being reduced to a desired height.

In some embodiments, prior to the removal of hardmask 810, photoresist 820 is removed. The process of removing photoresist 820 is similar to that of the process of removing photoresist 220.

Figure 10:
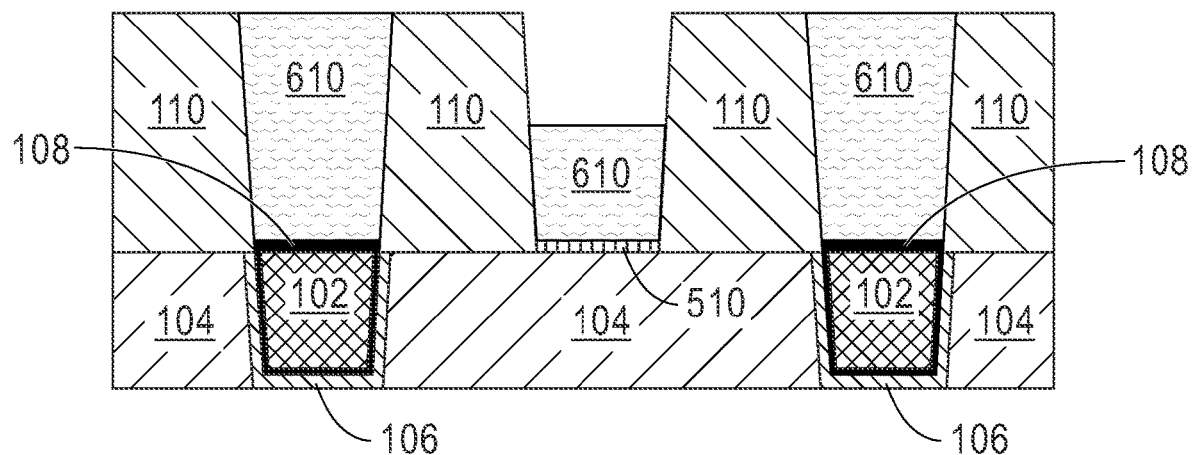
FIG. 10 depicts a process of removing the hardmask, in accordance with an embodiment of the invention.

FIG. 10 depicts a cross-sectional view of fabrication steps, in accordance with an embodiment of the present invention. FIG. 10 shows the removal of hardmask 810.

In some embodiments, subsequent to the formation of the vias, hardmask 810 is removed. In general, the process of removing hardmask 810 involves the use of an etching process, such as RIE, laser ablation, or any etch process which can be used to selectively remove a portion of material, such as hardmask 810. In some embodiments, prior to the removal of hardmask 810, photoresist 820 is removed. The process of removing photoresist 820 is similar to that of the process of removing hardmask 810.

Figure 11:
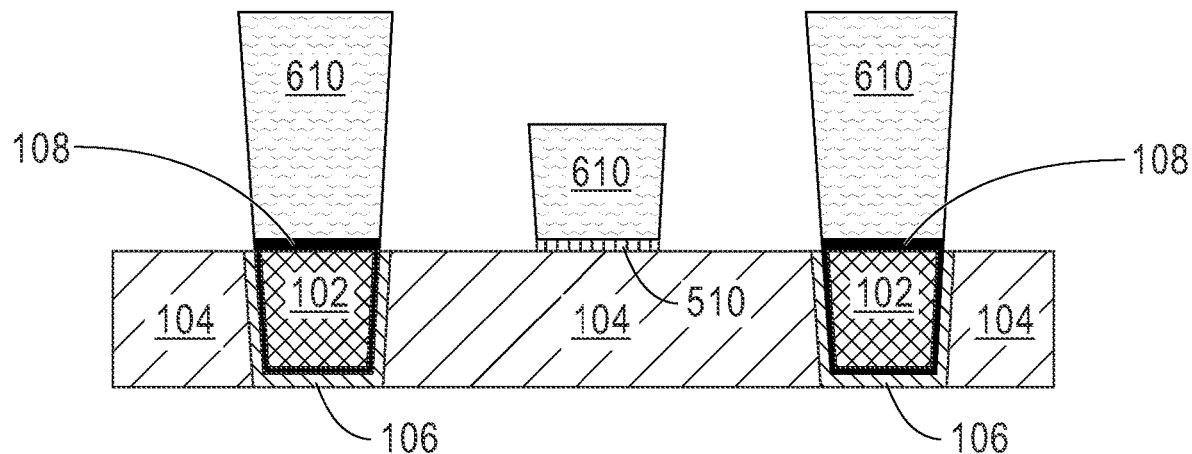
FIG. 11 depicts a process of removing the high modulus template, in accordance with an embodiment of the invention.

FIG. 11 depicts a cross-sectional view of fabrication steps, in accordance with an embodiment of the present invention. FIG. 11 shows the removal of high modulus template 110.

High modulus template 110 may be removed using an etching process that is selective in removing physically exposed portions of high modulus template 110 relative to metal layer 610, TaN layer 510, and liner 108 to remove all of high modulus template 110 and expose dielectric layer 104. The etching process utilized may be a dry etching or wet etching process.

Figure 12:
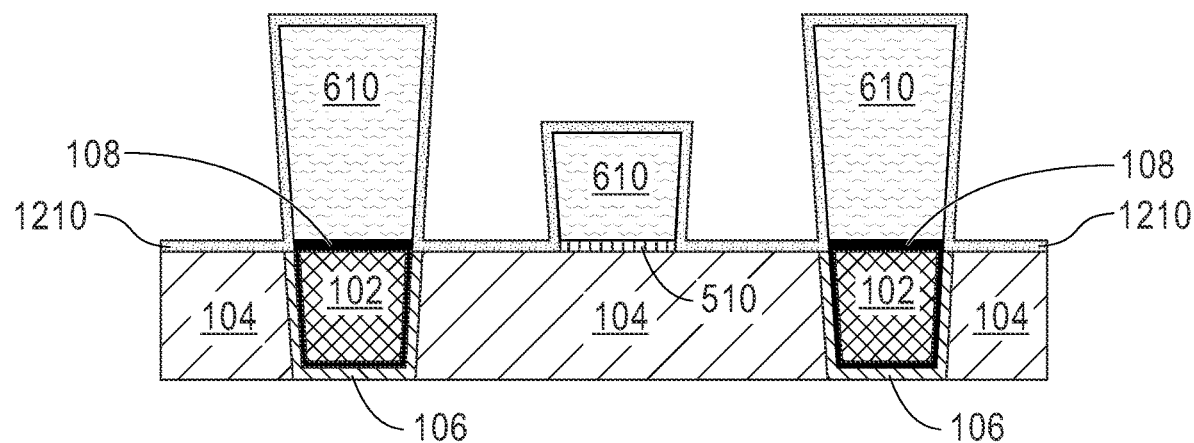
FIG. 12 depicts a process of forming a conformal dielectric layer, in accordance with an embodiment of the invention.

FIG. 12 depicts a cross-sectional view of fabrication steps, in accordance with an embodiment of the present invention. FIG. 12 shows the formation of conformal layer 1210.

Conformal layer 1210 may be a dielectric layer of insulating material, such as silicon nitride, over exposed surfaces (e.g., metal layer 610, dielectric layer 104). Conformal layer 1210 can be deposited using, for example, CVD, PECVD, PVD, or other deposition processes.

Figure 13:
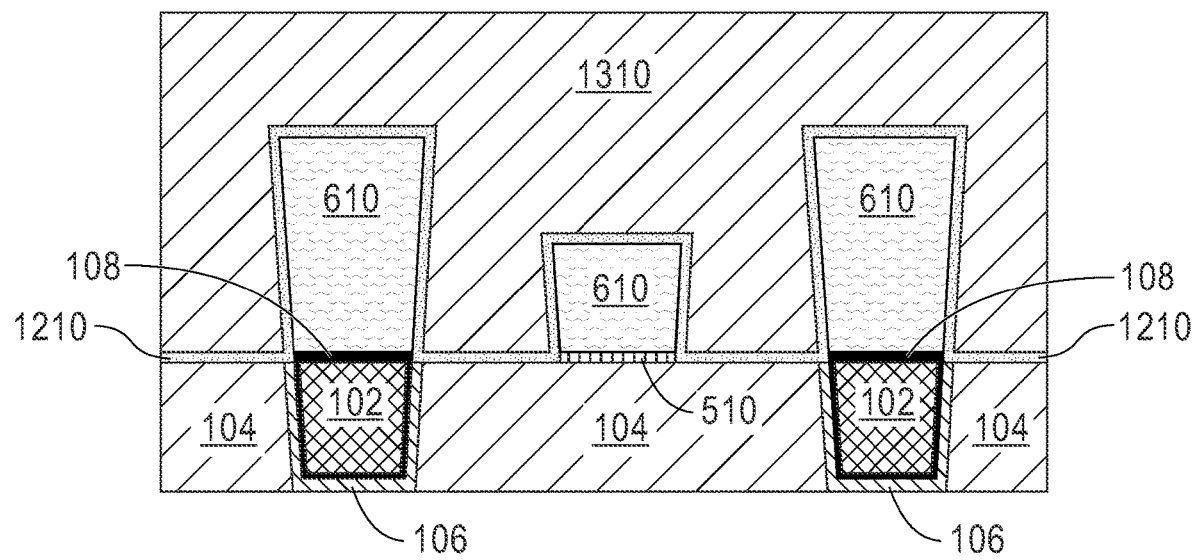
FIG. 13 depicts a process of forming a low-κ dielectric material layer, in accordance with an embodiment of the invention.

FIG. 13 depicts a cross-sectional view of fabrication steps, in accordance with an embodiment of the present invention. FIG. 13 shows the formation of low-κ layer 1310.

Low-κ layer 1310 is generally a layer of low-κ dielectric material. Low-κ is a material with a small relative dielectric constant (κ) relative to $SiO_2$. Low-κ materials include, for example, SiCOH, fluorine-doped $SiO_2$, organosilicate glass (OSG), porous $SiO_2$, porous organosilicate glass, spin-on organic polymeric dielectrics, and spin-on silicon based polymeric dielectrics. In some embodiments, low-κ layer 1310 is spin-on-glass. Spin-on-glass is an interlayer dielectric material applied in liquid form to fill narrow gaps in the sub-dielectric surface. In some embodiments, low-κ layer 1310 is deposited using flowable chemical vapor deposition (fCVD) or spin-on dielectric methods. Low-κ layer 1310 may be deposited above the desired height.

Figure 14:
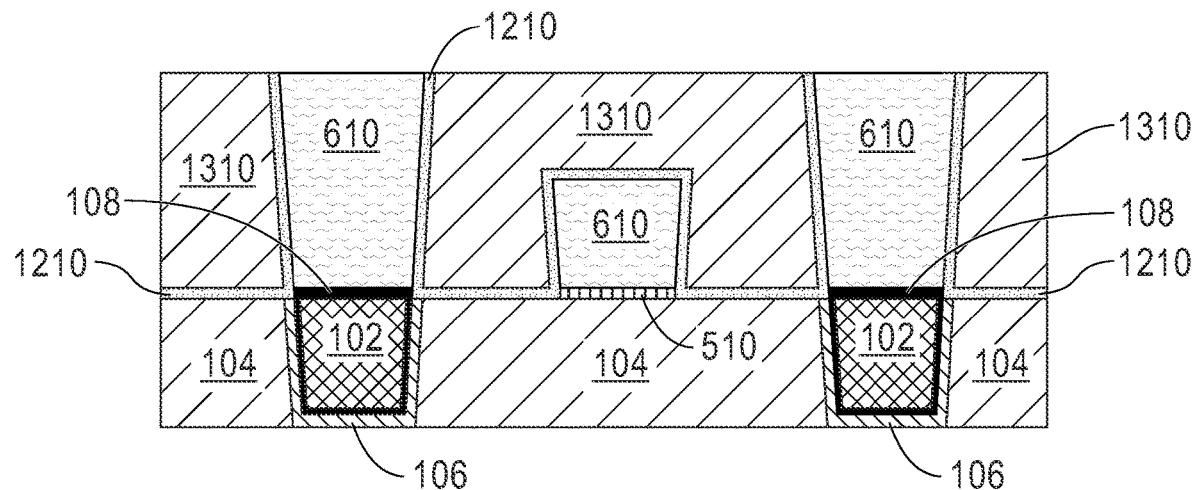
FIG. 14 depicts a process of removing upper portions of the low-κ dielectric material layer and the conformal dielectric layer to expose top surfaces of the vias, in accordance with an embodiment of the invention.

FIG. 14 depicts a cross-sectional view of fabrication steps, in accordance with an embodiment of the present invention. FIG. 14 shows removal of upper portions of low-κ layer 1310 and conformal layer 1210 to expose top surfaces of metal layer 610.

As described above with reference to FIG. 13, low-κ layer 1310 may be deposited above the desired height. Subsequently, utilizing a planarization process, such as CMP, the height of low-κ layer 1310 may be reduced such that the top surface of low-κ layer 1310 is coplanar with the topmost surfaces of metal layer 610.

Subsequent to reducing the height of low-κ layer 1310, a planarization process, such as CMP, is used to remove exposed upper portions of conformal layer 1210 to expose the topmost surfaces of metal layer 610.

Figure 15:
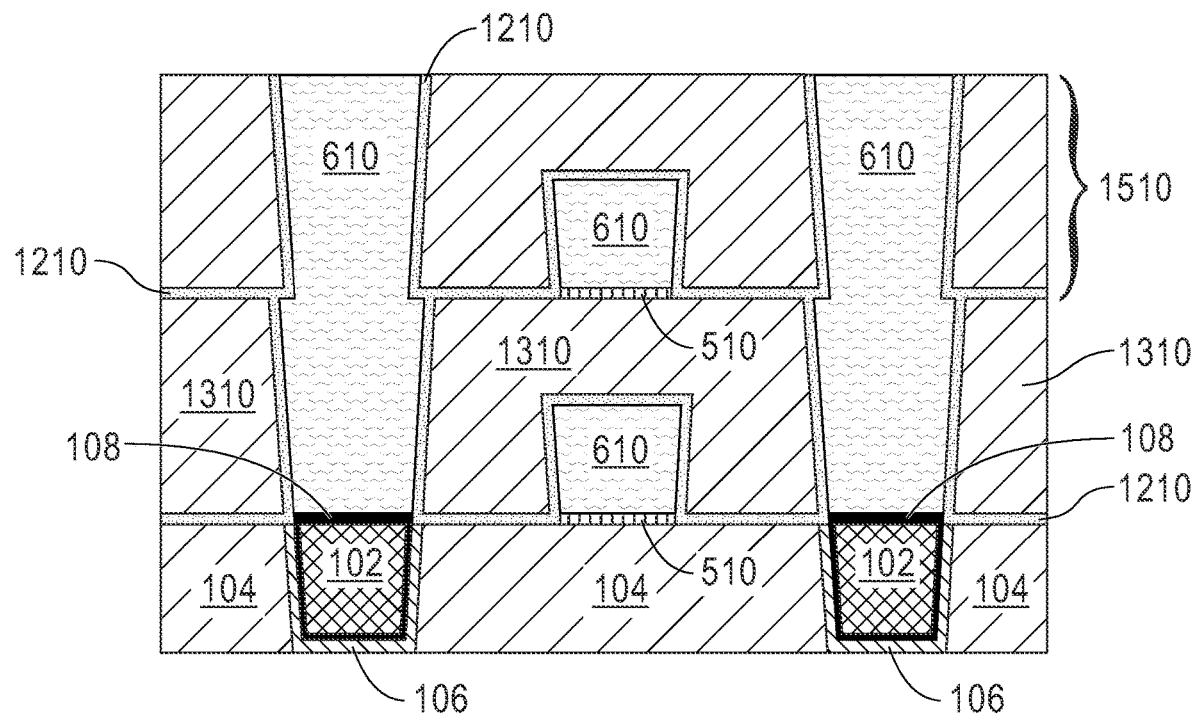
FIG. 15 depicts a process of forming a next level build for an additional metal layer on top of the structure of FIG. 14, in accordance with an embodiment of the invention.

FIG. 15 depicts a cross-sectional view of fabrication steps, in accordance with an embodiment of the present invention. FIG. 15 shows a next level build for an additional metal layer 1510.

Additional metal layer 1510 includes no barrier between the previously described vias formed in metal layer 610 and portions of metal layer 610 formed in additional metal layer 1510. Due to not having barrier metal between the via and above line (e.g., metal layer 610), low via R exists.

Additional metal layer 1510 may be formed on top of the structure described in FIG. 14 by utilizing the fabrication steps described with reference to FIGS. 1-14. While a single additional metal layer 1510 is depicted in FIG. 15, one of ordinary skill in the art would understand that multiple additional metal layers may be added. Further, one of ordinary skill in the art would understand that modifications may be made to additional metal layer 1510 related to the specific placement of vias and interconnect lines, as desired for the final overall structure.

The resulting structure is a BEOL metal line and top via interconnect structure, without barrier metal between the via and metal line above, formed using a high modulus template to reduce line wiggling. The high modulus template is replaced in the final structure with a low-κ dielectric material to reduce overall capacitance.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a conductive stack comprising a barrier liner, a liner, and a conductive line, wherein:
        the barrier liner directly contacts the liner and a dielectric layer;
        the liner is positioned between, and directly contacts, the barrier liner and the conductive line; and
        a top surface of the conductive line is below a topmost surface of the liner;
    a first via on the topmost surface of the liner above the conductive line; and
    a second via directly on a top surface of the first via layer.

2. The semiconductor structure of claim 1, wherein the conductive stack is positioned in a trench in a metallization layer of an interconnect structure.

3. The semiconductor structure of claim 1, wherein the first via and the second via comprise a same material.

4. The semiconductor structure of claim 1, wherein the conductive stack is positioned in a trench within the dielectric layer.

5. The semiconductor structure of claim 1, wherein the first via and the second via comprise Ru.

6. The semiconductor structure of claim 1, further comprising a low-K dielectric layer laterally adjacent to the first via and the second via.

7. The semiconductor structure of claim 6, further comprising a conformal dielectric layer located:
    Between a first portion of the low-κ dielectric layer and the first via;
    Between a second portion of the low-κ dielectric layer and the second via; and
    coplanar to a bottommost surface of the second via, separating the first portion of the low-κ dielectric layer from the second portion of the low-κ dielectric layer.

8. The semiconductor structure of claim 6, wherein the low-κ dielectric layer comprises SiCOH.

9. The semiconductor structure of claim 1, further comprising a TaN layer on a portion of the dielectric layer, wherein the TaN layer is laterally adjacent to the conductive stack.

10. The semiconductor structure of claim 9, further comprising metal located on the TaN layer of a height lower than the first via, the metal of a same material as the first via and the second via.

11. The semiconductor structure of claim 9, further comprising metal located on the TaN layer of a height lower than the first via, wherein a bottom surface of the metal located on the TaN layer is coplanar with a bottom surface of the conductive line.

* * * * *